(12) United States Patent
Zhang et al.

(10) Patent No.: US 11,846,605 B2
(45) Date of Patent: Dec. 19, 2023

(54) MAGNETIC PROPERTY MEASURING APPARATUS AND MAGNETIC PROPERTY MEASURING METHOD

(71) Applicant: SHOWA DENKO K.K., Tokyo (JP)

(72) Inventors: Lei Zhang, Chiba (JP); Fumito Kudo, Chiba (JP); Yuki Hirai, Chiba (JP); Masayuki Makita, Chiba (JP); Kensuke Yamanaka, Chiba (JP)

(73) Assignee: RESONAC CORPORATION, Tokyo (JP)

( * ) Notice: Subject to any disclaimer, the term of this patent is extended or adjusted under 35 U.S.C. 154(b) by 85 days.

(21) Appl. No.: 17/804,659

(22) Filed: May 31, 2022

(65) Prior Publication Data
US 2022/0381738 A1 Dec. 1, 2022

(30) Foreign Application Priority Data
Jun. 1, 2021 (JP) ................ 2021-092117

(51) Int. Cl.
*G11B 5/455* (2006.01)
*G01N 27/72* (2006.01)
*G01N 1/44* (2006.01)

(52) U.S. Cl.
CPC .............. *G01N 27/72* (2013.01); *G01N 1/44* (2013.01)

(58) Field of Classification Search
CPC .................... G01N 1/44; G01N 27/72
See application file for complete search history.

(56) References Cited

U.S. PATENT DOCUMENTS

2002/0095243 A1* 7/2002 Ghoshal ............. G05D 23/2401
700/299
2004/0210289 A1* 10/2004 Wang ................... A61K 9/5094
607/116

OTHER PUBLICATIONS

Douglas A. Saunders et al., "Magnetic Field Strength Measurements in Heat-Assisted Magnetic Recording", IEEE Transactions on Magnetics, vol. 55, No. 12, Dec. 2019.

* cited by examiner

*Primary Examiner* — Alesa Allgood
(74) *Attorney, Agent, or Firm* — IPUSA, PLLC

(57) ABSTRACT

A magnetic property measuring apparatus measures magnetic properties of a magnetic recording medium, and includes a rotating mechanism which rotates the magnetic recording medium, a heating or cooling mechanism which heats or cools the magnetic recording medium; a temperature measuring mechanism which measures a temperature of the magnetic recording medium, a laser heating mechanism, disposed opposite to a measurement site of the magnetic recording medium, which heats the measurement site without making contact with the measurement site, a magnetic write part, disposed opposite to the measurement site, which magnetizes the measurement site without making contact with the measurement site, and a magnetic read part, disposed opposite to the measurement site, which reads a magnetic flux leakage at the measurement site without making contact with the measurement site.

7 Claims, 5 Drawing Sheets

MAGNETIC PROPERTY MEASURING APPARATUS AND MAGNETIC PROPERTY MEASURING METHOD

CROSS-REFERENCE TO RELATED APPLICATIONS

This application is based upon and claims priority to Japanese Patent Application No. 2021-092117 filed on Jun. 1, 2021, the entire contents of which are incorporated herein by reference.

BACKGROUND OF THE INVENTION

1. Field of the Invention

The present invention relates to magnetic property measuring apparatuses, and magnetic property measuring methods.

2. Description of the Related Art

In order to further increase the storage capacity of hard disk drives (HDDs), magnetic recording media for high-density recording have been developed. In particular, there is active research and development on magnetic recording media (or thermal assist magnetic recording media) that record information using the thermal assist magnetic recording method that is expected to be suitable for the HDDs of the next generation.

The thermal assist magnetic recording method irradiates near-field light on the magnetic recording medium, by irradiating laser light generated from a laser light generator that is attached to a magnetic head on the magnetic recording medium, so as to locally heat a surface of the magnetic recording medium, to thereby locally reduce a coercivity when magnetically recording information.

A thermal assist magnetic recording medium includes a magnetic layer, a heat sink layer made of a high thermal conductivity material to increase heat gradient and heat dissipation properties, a thermal barrier layer provided under the magnetic layer to effectively heat the magnetic layer, a reflection control layer to reduce thermoreflection from the magnetic recording medium, or the like.

As a method of measuring the magnetic properties of the thermal assist magnetic recording medium, Douglas A. Saunders et al., "Magnetic Field Strength Measurements in Heat-Assisted Magnetic Recording", IEEE TRANSACTIONS ON MAGNETICS, VOL. 55, NO. 12, DECEMBER 2019 proposes a method of evaluating the magnetic properties of the thermal assist magnetic recording medium by varying an output of the laser light irradiated on the thermal assist magnetic recording medium, for example.

A laminated structure of the layers forming the thermal assist magnetic recording medium is designed to control a heating temperature, spreading of heat, or the like of the laser beam. When designing the laminated structure of the thermal assist magnetic recording medium, it is important to ascertain a Curie temperature of the magnetic layer and a variance of the Curie temperature.

The Curie temperature is a transition temperature at which a ferromagnetic material makes a transition into a paramagnetic material. In the thermal assist magnetic recording method, the surface of the magnetic recording medium is locally heated by the laser light from the laser light generator that is attached to the magnetic head, and the information is recorded by reducing a switching magnetic field of the magnetic layer.

The Curie temperature of a magnetic material included in the magnetic layer is generally measured by a vibration sample magnetometer (VSM) provided with a heating mechanism. However, even when the thermal assist magnetic recording medium is designed using the measured Curie temperature, there is a problem that the thermal assist magnetic recording medium does not exhibit the expected magnetic properties in some cases. In other words, because a heat sink layer, a heat barrier layer, a reflection control layer, or the like is often provided on the substrate side of the magnetic layer of the thermal assist magnetic recording medium, the flow of heat within the lamination structure of the thermal assist magnetic recording medium is complicated. In addition, because the magnetic layer has a granular structure made of columnar magnetic particles and non-magnetic grain boundaries and has thermal conductivity anisotropy, the flow of heat within the laminated structure of the thermal assist magnetic recording medium becomes more complicated. Therefore, the thermal assist magnetic recording medium may not exhibit the expected magnetic properties.

SUMMARY OF THE INVENTION

It is one object of the present disclosure to provide a magnetic property measuring apparatus and a magnetic property measuring method which are capable of measuring the effective magnetic properties of the magnetic layer constituting the thermal assist magnetic recording medium.

One aspect of the present disclosure provides a magnetic property measuring apparatus that measures magnetic properties of a magnetic recording medium, including a rotating mechanism configured to rotate the magnetic recording medium; a heating or cooling mechanism configured to heat or cool the magnetic recording medium; a temperature measuring mechanism configured to measure a temperature of the magnetic recording medium; a laser heating mechanism, disposed at a position opposing a measurement site of the magnetic recording medium, and configured to heat the measurement site without making contact with the measurement site; a magnetic write part, disposed at a position opposing the measurement site, and configured to magnetize the measurement site without making contact with the measurement site; and a magnetic read part, disposed at a position opposing the measurement site, and configured to read a magnetic flux leakage at the measurement site without making contact with the measurement site.

Another aspect of the present disclosure provides a magnetic property measuring method that measures the magnetic properties of the magnetic recording medium using the magnetic property measuring apparatus described above, including the steps of (A) rotating the magnetic recording medium by the rotating mechanism; (B) causing the laser heating mechanism, the magnetic write part, and the magnetic read part to float above and scan a surface of the magnetic recording medium; (C) maintaining the magnetic recording medium at a temperature X that is lower than a Curie temperature by the heating or cooling mechanism and the temperature measuring mechanism; (D) magnetizing the measurement site of the magnetic recording medium to a saturation state by the laser heating mechanism and the magnetic write part; (E) demagnetizing the measurement site magnetized to the saturation state in the step (D), by heating the measurement site by the laser heating mechanism to read a magnetic flux leakage at the demagnetized site by the magnetic read part; (F) determining a relationship between a laser heating amount and the magnetic flux leakage in the step (E), by repeating the step (D) and the step (E); (G) maintaining the magnetic recording medium at a temperature Y that is lower than the Curie temperature and different from the temperature X, by the heating or cooling mechanism and the temperature measuring mechanism; (H) reading the magnetic flux leakage at the demagnetized site by the magnetic read part, by heating and demagnetizing the measurement site magnetized to the saturation state by the laser heating mechanism; (I) reading the magnetic flux leakage at the demagnetized site by the magnetic read part, by heating and demagnetizing the measurement site, magnetized to the saturation state in the step (H), by the laser heating mechanism; (J) determining the relationship between the laser heating amount and the magnetic flux leakage in the step (I), by repeating the step (H) and the step (I) while varying the laser heating amount in the step (I); and (K) computing the magnetic properties of the magnetic recording medium from the relationship between the laser heating amount and the magnetic flux leakage determined in the step (F) and the step (J).

Other objects and further features of the present invention will be apparent from the following detailed description when read in conjunction with the accompanying drawings.

DESCRIPTION OF THE PREFERRED EMBODIMENTS

Figure 1:
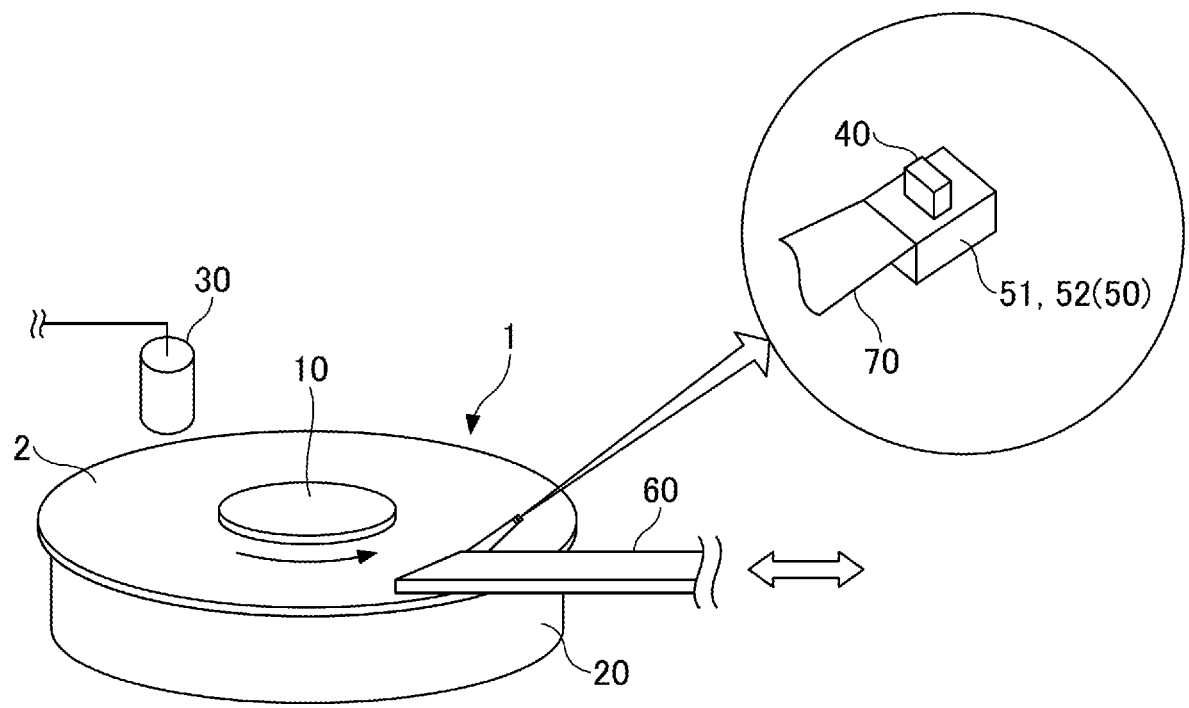
FIG. 1 is a perspective view schematically illustrating an example of a configuration of a magnetic property measuring apparatus according to one embodiment of the present invention.

Hereinafter, embodiments of the present disclosure will be described in detail. The embodiments are not limited to the examples described in the following, and a number, configuration, position, material, or the like of constituent elements may be modified unless otherwise indicated. In order to facilitate understanding of the description, the same constituent elements in the drawings are designated by the same reference numerals, and a repeated description of the same constituent elements may be omitted. In addition, the constituent elements in the drawings may be not be drawn to actual scale, and the scale may differ among the figures. A "range from A to B" refers to a range including a lower limit value A and an upper limit value B of the range, unless otherwise indicated.

[Magnetic Property Measuring Apparatus]

A magnetic property measuring apparatus according to the present embodiment will be described. In the present embodiment, a case where the magnetic property measuring apparatus magnetically records information on (hereinafter also referred to as "writes information to") a magnetic recording medium using a thermal assist magnetic recording method will be described. Magnetically reproducing information from the magnetic recording medium is also referred to as "reading information from" the magnetic recording medium. In this specification, the magnetic recording medium on which the information is magnetically written using the thermal assist magnetic recording method will be referred to as a thermal assist magnetic recording medium.

FIG. 1 is a perspective view schematically illustrating an example of a configuration of the magnetic property measuring apparatus according to the present embodiment. As illustrated in FIG. 1, a magnetic property measuring apparatus 1 includes a rotating mechanism 10, a heating or cooling mechanism 20, a temperature measuring mechanism 30, a laser heating mechanism 40, and a magnetic head 50. The magnetic property measuring apparatus 1 measures magnetic properties of a thermal assist magnetic recording medium (or measurement sample) 2 used in a hard disk drive (HDD). The magnetic property measuring apparatus 1 may include a magnetic head drive mechanism 60, in addition to the constituent elements described above.

The rotating mechanism 10 rotates the thermal assist magnetic recording medium 2. The thermal assist magnetic recording medium 2 typically has a disk shape with a center opening, and in the example illustrated in FIG. 1, the rotating mechanism 10 has a spindle shaft configured to hold the thermal assist magnetic recording medium 2 via the center opening of the thermal assist magnetic recording medium 2. The rotating mechanism 10 rotates the thermal assist magnetic recording medium 2, preferably in a range of 5000 rpm to 10000 rpm, for example.

The heating or cooling mechanism 20 heats or cools the thermal assist magnetic recording medium 2. A temperature range of the heating or cooling is preferably greater than or equal to 0° C. (273 K), which is a lower limit value of an operating temperature of the HDD, and less than a Curie temperature of a magnetic material used for the thermal assist magnetic recording medium 2.

The heating or cooling mechanism 20 may have a known configuration, such as that of a ceramic heater, Peltier element, or the like. The heating or cooling mechanism 20 may be a contact type which heats or cools the thermal assist magnetic recording medium 2 by making contact with the thermal assist magnetic recording medium 2, or a non-contact type which heats or cools the thermal assist magnetic recording medium 2 without making contact with the thermal assist magnetic recording medium 2. The contact type heating or cooling mechanism 20 preferably heats or cools the thermal assist magnetic recording medium 2 by heat conduction. On the other hand, the non-contact type heating or cooling mechanism 20 preferably heats or cools the thermal assist magnetic recording medium 2 by heat radiation.

The temperature measuring mechanism 30 measures a temperature of the thermal assist magnetic recording medium 2. The temperature measuring mechanism 30 is used to maintain the temperature of the thermal assist magnetic recording medium 2 constant. The temperature measuring mechanism 30 may have any configuration, including a known configuration, capable of measuring the temperature of the thermal assist magnetic recording medium 2. For example, a thermocouple may be used in the case of a contact type temperature measuring mechanism 30, and a radiation thermometer may be used in the case of a non-contact type temperature measuring mechanism. Because the magnetic property measuring apparatus 1 heats or cools a back surface of the thermal assist magnetic recording medium 2, and makes the measurement of a front surface of the thermal assist magnetic recording medium 2, opposite to the back surface, a temperature difference may occur between the front and back surfaces of the thermal assist magnetic recording medium 2. For this reason, the temperature measuring mechanism 30 is preferably disposed at a position opposing the thermal assist magnetic recording medium 2, so as to make a non-contact measurement of the front surface of the thermal assist magnetic recording medium 2.

The laser heating mechanism 40 locally heats a measurement site of thermal assist magnetic recording medium 2 without making contact with the measurement site. The laser heating mechanism 40 is disposed at a position opposing the thermal assist magnetic recording medium 2, so as to heat the measurement site of the thermal assist magnetic recording medium 2 from the front surface of the thermal assist magnetic recording medium 2. In other words, the laser heating mechanism 40 is attached to the magnetic head 50 as illustrated in FIG. 1, and the magnetic head 50, and thus the laser heating mechanism 40, is caused to scan the surface of the thermal assist magnetic recording medium 2 by the magnetic head drive mechanism 60. The laser heating mechanism 40 scans in a state floating from the front surface of the thermal assist magnetic recording medium 2 due to air vortex generated between the laser heating mechanism 40 and the thermal assist magnetic recording medium 2 that is driven to rotate by the rotating mechanism 10.

Because the magnetic property measuring apparatus 1 is intended to measure effective magnetic properties of the thermal assist magnetic recording medium 2, the laser heating mechanism 40 preferably has the same configuration as, or a configuration similar as much as possible to that of a laser heating mechanism used by a magnetic head of the HDD employing the thermal assist magnetic recording method. In other words, the laser heating mechanism 40 preferably uses, as a light source, a semiconductor laser that emits a laser beam having a wavelength in a range of 780 nm to 980 nm. A beam diameter of the laser beam is preferably greater than or equal to a track width of the HDD, and more preferably greater than or equal to 40 nm. In this example, the measurement site is a site of the thermal assist magnetic recording medium 2 where the laser beam is irradiated. In addition, the laser heating mechanism 40 may use a near-field transducer (NFT) and an optical waveguide, similar to the magnetic head of the HDD employing the thermal assist magnetic recording method.

The magnetic head 50 includes a magnetic write part 51 and a magnetic read part 52.

The magnetic write part 51 is disposed at a position opposing the measurement site of the thermal assist magnetic recording medium 2, and is configured to magnetize the measurement site of the thermal assist magnetic recording medium 2. The magnetic write part 51 is disposed at a position opposing the thermal assist magnetic recording medium 2, in order to magnetize the measurement site of the thermal assist magnetic recording medium 2. In other words, the magnetic write part 51 is attached to a suspension 70 as illustrated in FIG. 1, and is caused to scan the front surface of the thermal assist magnetic recording medium 2 by the magnetic head drive mechanism 60. The magnetic write part 51 scans in a state floating from the front surface of the thermal assist magnetic recording medium 2 due to air vortex generated between the magnetic write part 51 and the thermal assist magnetic recording medium 2 that is driven to rotate by the rotating mechanism 10.

Because the magnetic property measuring apparatus 1 is intended to measure the effective magnetic properties of the thermal assist magnetic recording medium 2, the magnetic write part 51 preferably has the same configuration as, or a configuration similar as much as possible to that of a magnetic write part used by the magnetic head of the HDD employing the thermal assist magnetic recording method. In other words, the magnetic write part 51 preferably uses a thin film head including an electromagnet that is formed by a combination of a coil and a magnetic body, wherein the coil is famed on a surface of the magnetic body by etching in order to reduce a magnetic write area.

The magnetic write area is preferably approximately the same as the track width of the HDD, and in particular, preferably approximately 40 nm.

The magnetic read part 52 is disposed at a position opposing the measurement site of the thermal assist magnetic recording medium 2, and is configured to read a magnetic flux leakage from the measurement site of the thermal assist magnetic recording medium 2. The magnetic read part 52 is disposed at the position opposing the thermal assist magnetic recording medium 2, in order to read the magnetic flux leakage from the measurement site of the thermal assist magnetic recording medium 2. In other words, the magnetic read part 52 is attached to the suspension 70 as illustrated in FIG. 1, and is caused to scan the front surface of the thermal assist magnetic recording medium 2 by the magnetic head drive mechanism 60. The magnetic read part 52 scans in a state floating from the front surface of the thermal assist magnetic recording medium 2 due to air vortex generated between the magnetic read part 52 and the thermal assist magnetic recording medium 2 that is driven to rotate by the rotating mechanism 10.

Because the magnetic read part 52 is intended to measure the effective magnetic properties of the thermal assist magnetic recording medium 2, the magnetic read part 52 preferably has the same configuration as, or a configuration similar as much as possible to that of a magnetic read part used by the magnetic head of the HDD employing the thermal assist magnetic recording method. In other words, the magnetic read part 52 preferably uses a magneto resistive (MR) head having a high sensitivity by utilizing a magneto-resistive effect, a giant magneto resistive (GMR) head utilizing a giant magneto-resistive effect, a tunneling magneto resistive (TMR) head utilizing a tunneling magneto-resistive effect, or the like.

A magnetic read area is preferably approximately the same as the track width of the HDD, and in particular, preferably approximately 40 nm.

As described above, the magnetic property measuring apparatus 1 according to the present embodiment includes the rotating mechanism 10, the heating or cooling mechanism 20, the temperature measuring mechanism 30, the laser heating mechanism 40, and the magnetic head 50. In addition, the laser heating mechanism 40 and the magnetic head 50 can have the same configuration as, or the configuration similar as much as possible to that of the laser heating mechanism and the magnetic head (magnetic write part and magnetic read part) used by the magnetic head of the HDD employing the thermal assist magnetic recording method. Accordingly, the magnetic property measuring apparatus 1 can measure the effective magnetic properties of the thermal assist magnetic recording medium 2. Hence, the magnetic property measuring apparatus 1 enables a more efficient design of the laminated structure of the thermal assist magnetic recording medium 2.

The magnetic property measuring apparatus 1 includes the temperature measuring mechanism 30 disposed at the position opposing the thermal assist magnetic recording medium 2, and makes the non-contact measurement of the temperature of the thermal assist magnetic recording medium 2. Because the thermal assist magnetic recording medium 2 is heated or cooled from the back surface of the thermal assist magnetic recording medium 2 by the heating or cooling mechanism 20, and the front surface of the thermal assist magnetic recording medium 2 is measured, a temperature difference may occur between the front and the back surfaces of the thermal assist magnetic recording medium 2. The magnetic property measuring apparatus 1 can reduce the temperature difference that may occur between the front and back surfaces of the thermal assist magnetic recording medium 2, by making the non-contact measurement of the temperature of the thermal assist magnetic recording medium 2 by the temperature measuring mechanism 30, and can thus measure the temperature of the thermal assist magnetic recording medium 2 with a high accuracy.

[Magnetic Property Measuring Method]

A magnetic property measuring method according to the present embodiment will be described for an example applied to the thermal assist magnetic recording medium. The magnetic property measuring method according to the present embodiment uses the magnetic property measuring apparatus according to the present embodiment.

In the magnetic property measuring method according to the present embodiment, the thermal assist magnetic recording medium 2, which is a magnetic recording medium, is held on the spindle shaft forming the rotating mechanism 10 and rotated thereby (step A).

Next, the magnetic head 50, that includes the laser heating mechanism 40, the magnetic write part 51, and the magnetic read part 52, is caused to float above and scan the front surface of the thermal assist magnetic recording medium 2 (step B).

Next, the thermal assist magnetic recording medium 2 is maintained at a temperature X lower than a Curie temperature, by the heating or cooling mechanism 20 disposed immediately under the back surface of the thermal assist magnetic recording medium 2, and the temperature measuring mechanism 30 disposed to oppose the front surface of the thermal assist magnetic recording medium 2 without making contact therewith (step C). The temperature X may be a temperature of a substrate of the thermal assist magnetic recording medium 2.

Next, the measurement site of the thermal assist magnetic recording medium 2 is magnetized to a saturation state by the laser heating mechanism 40 and the magnetic write part 51 provided in the magnetic head 50 (step D).

In other words, because the magnetic material used for the thermal assist magnetic recording medium 2 has a high coercivity, the front surface of the thermal assist magnetic recording medium 2 is locally heated by the laser heating mechanism 40, and a magnetic switching field of the magnetic material is lowered, when writing the information.

Next, the measurement site magnetized to the saturation state is heated by the laser heating mechanism 40, to demagnetize the magnetic material at the heated measurement site of the thermal assist magnetic recording medium 2, and a magnetic flux leakage at the demagnetized site of the thermal assist magnetic recording medium 2 is read by the magnetic read part 52 provided in the magnetic head 50 (step E).

Next, in a state where the thermal assist magnetic recording medium 2 in step C is maintained at the predetermined temperature (temperature X), a laser heating amount in step E is varied, to repeat step D and step E, and determine a relationship between the laser heating amount and the magnetic flux leakage in step E (step F).

In step F, it is important to repeat step D and step E. It is conceivable to perform step D only once, and thereafter repeat step E while gradually increasing the laser heating amount. But when such a conceivable method is employed, a cause of error, such as a slight variation in a floating height (or flying height) of the magnetic head 50 or the like, will be added in each step E. For this reason, errors in the Curie temperature and a variance of the Curie temperature of the thermal assist magnetic recording medium 2 that is ultimately obtained will become large.

Figure 2:
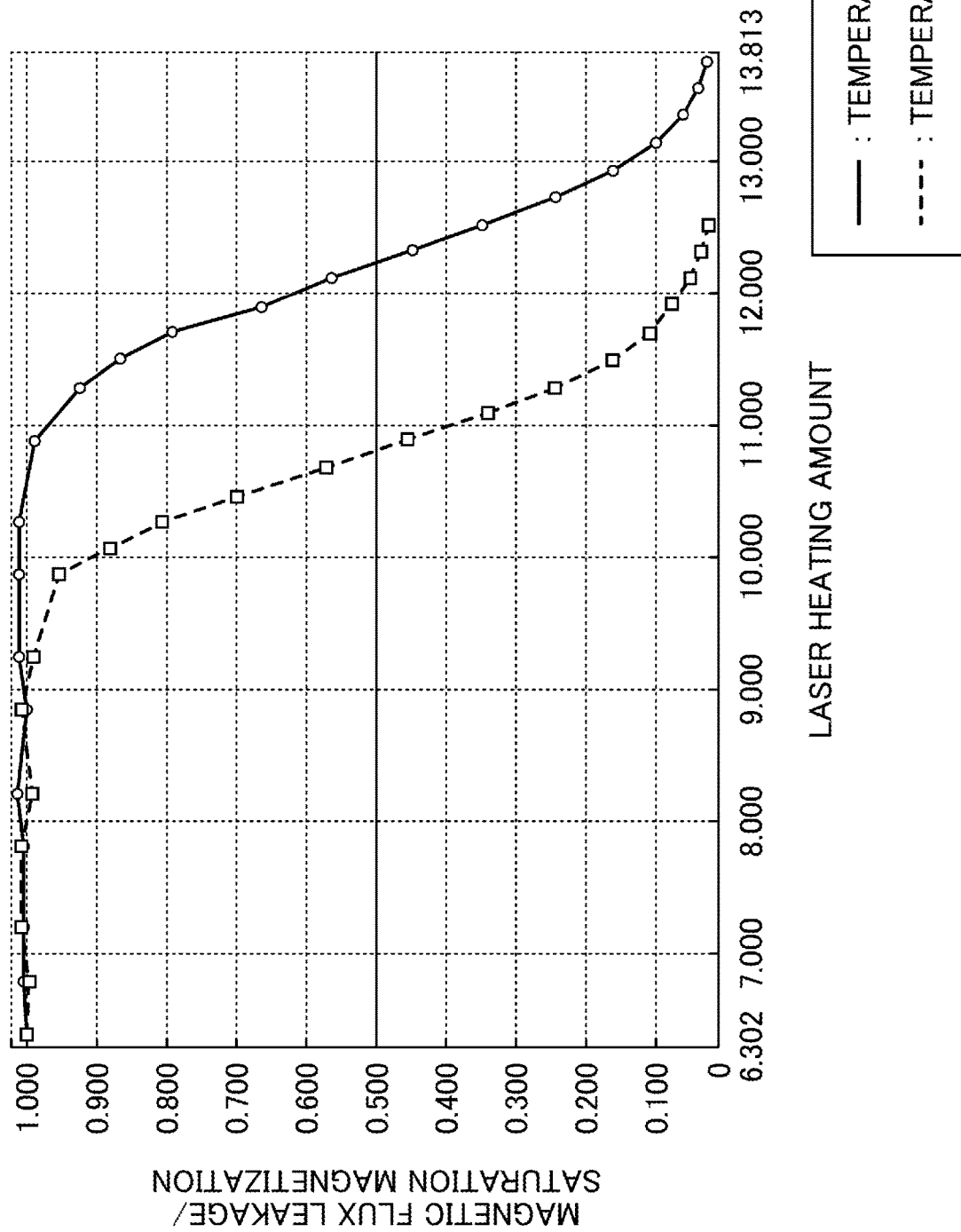
FIG. 2 is a diagram illustrating examples of a relationship between a laser heating amount and "(magnetic flux leakage (/(saturation magnetization)"

A ratio of the magnetic flux leakage refers to a ratio of the magnetic flux leakage with respect to the saturation magnetization at the measurement site, namely, "(magnetic flux leakage)/(saturation magnetization)". As illustrated in FIG. 2 which will be described later, when a magnetic layer reaches a temperature near the Curie temperature by the heating of the laser heating mechanism 40, the magnetic layer in the saturation magnetization state is gradually demagnetized. In the magnetic properties of the thermal assist magnetic recording medium 2 illustrated by the curve in FIG. 2, important points include a point where the ratio of the magnetic flux leakage starts to decrease from 1, a point where the ratio of the magnetic flux leakage becomes 0.5, and a point where the ratio of the magnetic flux leakage becomes zero, and the point where the ratio of the magnetic flux leakage becomes 0.5 is a particularly important point.

The point where the ratio of the magnetic flux leakage becomes 0.5 indicates a point where one-half of the magnetic particles forming the magnetic layer are demagnetized by the laser heating, and indicates a Curie temperature Tc (for example, an average value) of the thermal assist magnetic recording medium 2. The point where the ratio of the magnetic flux leakage becomes zero indicates a point where all of the magnetic particles forming the magnetic layer are demagnetized, and indicates a maximum Curie temperature of the thermal assist magnetic recording medium 2. When determining the relationship between the laser heating amount and the magnetic flux leakage in step F, a measurement error may occur. For this reason, it is preferable to measure the laser heating amount and the magnetic flux leakage multiple times (for example, three times), and use an average value of the measured results.

Next, the temperature of the thermal assist magnetic recording medium 2 is maintained at a substrate temperature Y, that is lower than the Curie temperature and different from the temperature X, by the heating or cooling mechanism 20 and the temperature measuring mechanism 30 (step G). The temperature Y may be the temperature of the substrate of the thermal assist magnetic recording medium 2, similar to the temperature X.

Next, the relationship between the laser heating amount and the magnetic flux leakage at the temperature Y is determined in a manner similar to determining the relationship at the temperature X.

In other words, similar to step D through step F described above, the measurement site of the thermal assist magnetic recording medium 2 is magnetized to the saturation state by the laser heating mechanism 40 and the magnetic write part 51 provided in the magnetic head 50 (step H).

Next, the measurement site magnetized to the saturation state is heated by the laser heating mechanism 40, to demagnetize the magnetic material at the heated site of the thermal assist magnetic recording medium 2, and a magnetic flux leakage at the demagnetized site of the thermal assist magnetic recording medium 2 is read by the magnetic read part 52 provided in the magnetic head 50 (step I).

Next, in a state where the thermal assist magnetic recording medium 2 in step G is maintained at the predetermined temperature (temperature Y), the laser heating amount in step I is varied, to repeat step H and step I, and determine a relationship between the laser heating amount and the magnetic flux leakage in step I (step J).

In step J, it is important to repeat step H and step I, for the reasons described above with respect to step D and step E.

Figure 3:
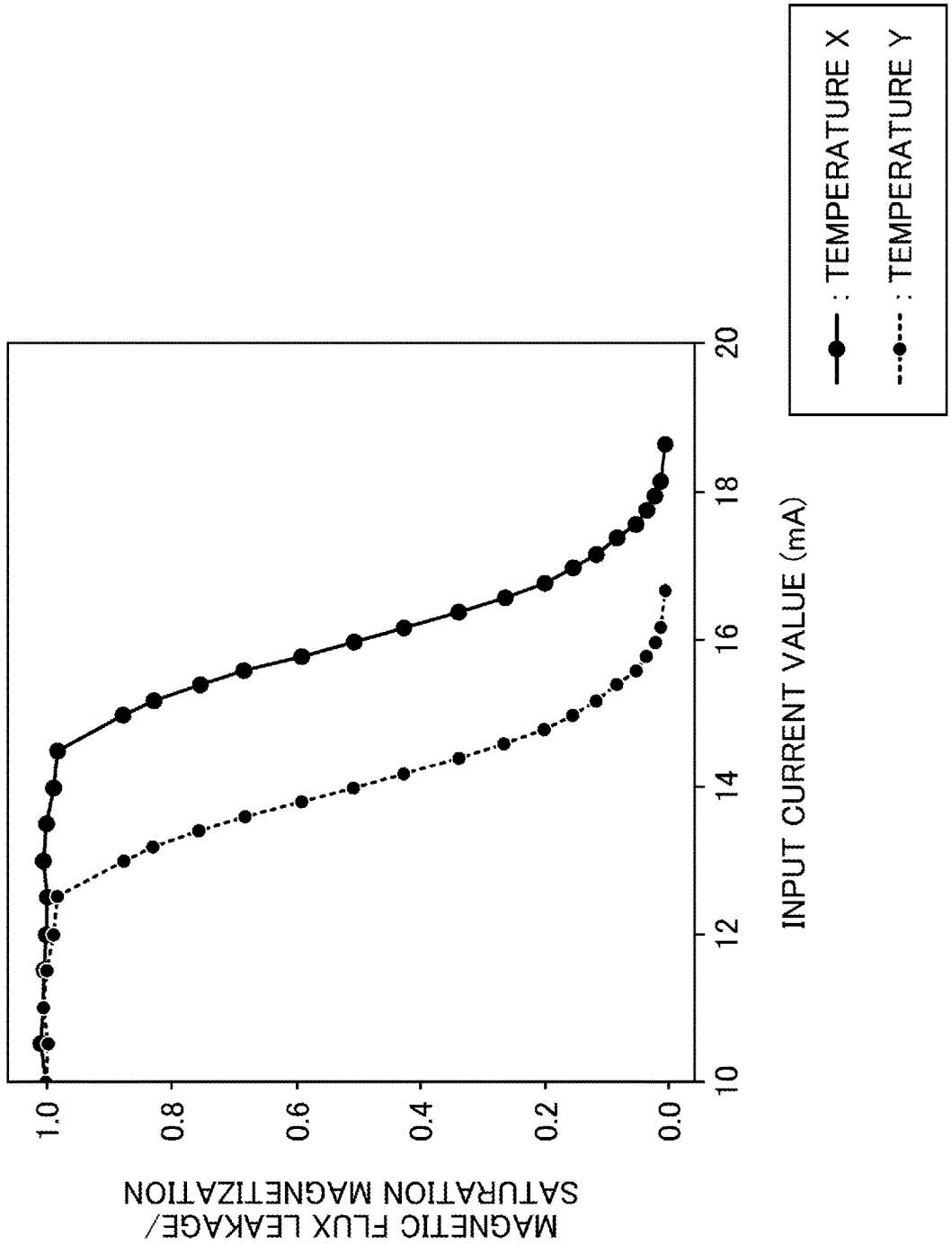
FIG. 3 is a diagram illustrating examples of a relationship between an input current value and the "(magnetic flux leakage)/(saturation magnetization)"

FIG. 2 and FIG. 3 illustrate examples of the relationship between the laser heating amount and the "(magnetic flux leakage)/(saturation magnetization)" obtained in step J at the substrate temperature Y. FIG. 2 illustrates the example of the relationship between the laser heating amount and the "(magnetic flux leakage)/(saturation magnetization)", and in FIG. 2, the ordinate indicates the "(magnetic flux leakage)/(saturation magnetization)", and the abscissa indicates the laser heating amount in arbitrary units. FIG. 3 illustrates the example of the relationship between the input current value applied to the laser heating mechanism 40 and the "(magnetic flux leakage)/(saturation magnetization)", and in FIG. 3, the ordinate indicates the "(magnetic flux leakage)/(saturation magnetization)", and the abscissa indicates the input current value (mA). As illustrated in FIG. 2 and FIG. 3, the two curves are shifted with respect to each other in a direction parallel to the abscissa, and an amount of the shift indicates a difference between the relationships for the temperature X and the temperature Y.

Because a measurement time of the magnetic flux leakage is extremely short, heat diffusion from the measurement site during the measurement of the magnetic flux leakage can be ignored. For this reason, it may be regarded that a relationship between the input current value to the laser heating mechanism 40 and a temperature rising amount of the measurement site is a proportional relationship. In other words, the relationship of the following formula (1) stands, when the substrate temperature is denoted by $T_0$(K), the input current value to the laser heating mechanism 40 is denoted by $L_P$ (mA), and the temperature of the measurement site is denoted by $T_L$ (K).

$$T_L = C_E \times L_P + T_0 \quad (1)$$

In the formula (1), $C_E$ (K/mA) denotes a heating efficiency corresponding to the temperature rise caused by a 1 (mA) increase in the input current value $L_P$ (mA) to the laser heating mechanism 40.

More particularly, a temperature at which the "(magnetic flux leakage)/(saturation magnetization)" becomes equal to 0.5 is a constant value determined according to the thermal assist magnetic recording medium 2. For this reason, the following formulas (2) and (3) stand when the input current value to the laser heating mechanism 40 in a state where the laser beam from the laser heating mechanism 40 is irradiated at the substrate temperature X and the "(magnetic flux leakage)/(saturation magnetization)" becomes equal to 0.5 is denoted by $L_{P1}$ (mA), the input current value to the laser heating mechanism 40 in a state where the laser beam from the laser heating mechanism 40 is irradiated at the substrate temperature Y and the "(magnetic flux leakage)/(saturation magnetization)" becomes equal to 0.5 is denoted by $L_{P2}$ (mA), and the temperature (effective Curie temperature) of the thermal assist magnetic recording medium 2 at which the "(magnetic flux leakage)/(saturation magnetization)" becomes equal to 0.5 is denoted by $T_{0.5}$ (K).

$$T_{0.5} = C_E \times L_{P1} + X \quad (2)$$

$$T_{0.5} = C_E \times L_{P2} + Y \quad (3)$$

In the formulas (2) and (3), X, Y, $L_{P1}$, and $L_{P2}$ are known values, and $C_E$ and $T_{0.5}$ are two unknown values, and the heating efficiency $C_E$ and the temperature $T_{0.5}$ can be determined from these formulas (2) and (3).

For example, in the example illustrated in FIG. 3, the substrate temperature X is 348 K, and the substrate temperature Y is 298 K. The input current value to the laser heating mechanism 40 at the substrate temperature X when the temperature $T_{0.5}$ at which the "(magnetic flux leakage)/(saturation magnetization)" becomes equal to 0.5 is 16 (mA), and the input current value to the laser heating mechanism 40 at the substrate temperature Y when the temperature $T_{0.5}$ at which the "(magnetic flux leakage)/(saturation magnetization)" becomes equal to 0.5 is 14 (mA). From the formulas (2) and (3) described above, the heating efficiency $C_E$ of the laser heating mechanism 40 can be determined as being 25 (K/mA), and the temperature $T_{0.5}$ as being 698 (K).

When the relationship between the input current value to the laser heating mechanism 40 and the temperature of the measurement site is determined, this relationship can be converted into a relationship between the laser heating amount of the thermal assist magnetic recording medium 2 by the laser heating mechanism 40 (or the input current value to the laser heating mechanism 40) and the temperature of the measurement site.

The method described above determines the temperature $T_{0.5}$ directly from the plot based on measured data, but in a case where a measurement error occurs locally near the input current value at the temperature $T_{0.5}$, the error of the temperature $T_{0.5}$ that is determined becomes large.

Hence, as will be described below, according to a method of regression from the measured data to a function, it is possible to determine the temperature $T_{0.5}$ (effective Curie temperature) more accurately, and also determine a standard deviation $\sigma$ in a distribution of the Curie temperature Tc of the magnetic particles of the magnetic layer.

The magnetic flux leakage of the thermal assist magnetic recording medium 2 that is measured may be regarded as corresponding to a sum of the magnetic fields generated by each of the magnetic particles of the magnetic layer. Further, when a magnetic field M generated by each of the magnetized magnetic particles of the magnetic layer is the same, a ratio (or percentage) of the magnetic particles of the magnetic layer that have not reached the Curie temperature Tc at the temperature $T_L$ of the measurement site (that is, magnetic particles satisfying Tc←$T_L$) is $P_1$, and a ratio (or percentage) of the magnetic particles of the magnetic layer that have reached the Curie temperature Tc at the temperature $T_L$ of the measurement site (that is, magnetic particles satisfying Tc<=$T_L$) is $P_2$ (where $P_1+P_2=1$), the "(magnetic flux leakage)/(saturation magnetization)" of the thermal assist magnetic recording medium 2 can be represented by $P_1M/(P_1+P_2)M=P_1$.

The ratio $P_2$ of the magnetic particles of the magnetic layer that have reached the Curie temperature Tc is a summation of the ratios of the magnetic particles of the magnetic layer having the Curie temperature Tc lower than or equal to the temperature of the measurement site. In other words, the "(magnetic flux leakage)/(saturation magnetization)" of the thermal assist magnetic recording medium 2 at the temperature $T_L$ of the measurement site is a value $(1-P_2)$ obtained by subtracting, from 1, an accumulated value from 0 (K) to the temperature $T_L$ of the measurement site in the distribution of the Curie temperature of the magnetic particles of the magnetic layer.

By observing the shape of the curve representing a change in the "(magnetic flux leakage)/(saturation magnetization)" with respect to the input current value (mA), it may be estimated that this change follows a function $(1-\Phi)$ obtained by subtracting, from 1.0, a cumulative distribution function $\Phi$ of a normal distribution.

As described above, the input current value to the laser heating mechanism 40 and the temperature of the measurement site are in the proportional relationship. Accordingly, in a case where a relationship $f(L_P)$ between the laser heating amount $L_P$ and the "(magnetic flux leakage)/(saturation magnetization)" follows the function $(1-\Phi)$, a ratio $P(T_L)$ $(=P_2=1-P_1=1-f(L_P))$ of the magnetic particles of the magnetic layer that have reached the Curie temperature Tc at the temperature $T_L$ of the measurement site (that is, magnetic particles satisfying Tc<=$T_L$) also follows the cumulative distribution function $\Phi$ of the normal distribution. For this reason, it may be estimated that a function P(Tc) representing the ratio of the magnetic particles of the magnetic layer having the Curie temperature Tc follows the normal distribution.

Figure 4:
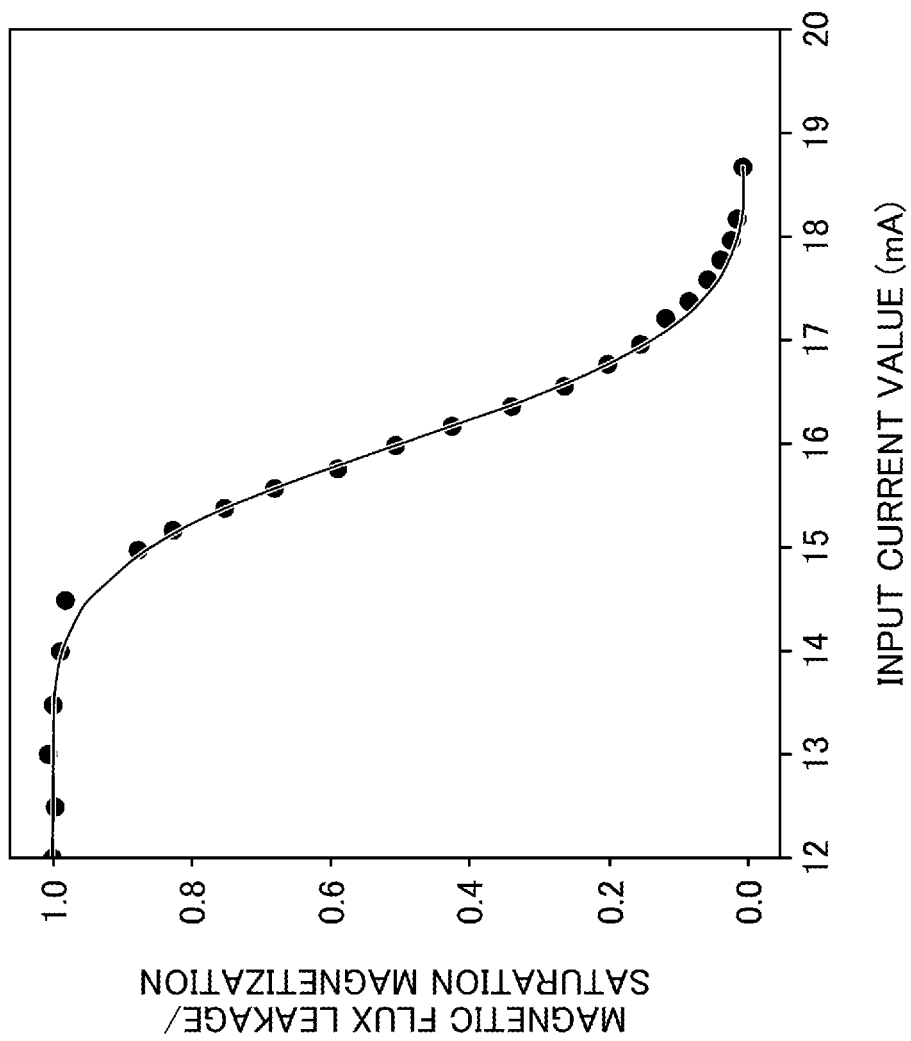
FIG. 4 is a diagram illustrating an example of the relationship between the input current value and the "(magnetic flux leakage)/(saturation magnetization)"

FIG. 4 is a diagram illustrating a relationship between a plot based on the measured data of the "(magnetic flux leakage)/(saturation magnetization)" with respect to the input current value (mA) at the substrate temperature X, and the function obtained by the regression from the plot. The function obtained by the regression is $[1-\Phi\{(x-\mu_1)/\sigma_1\}]$, where $\Phi\{(x-\mu_1)/\sigma_1\}$ denotes a cumulative distribution function of the normal distribution, x denotes a value of the laser heating amount $L_P$, $\mu_1$ denotes a median in the normal distribution, and $\sigma_1$ denotes a standard deviation in the normal distribution. The plot illustrated in FIG. 4 corresponds to the measured data at the substrate temperature X in FIG. 3. In FIG. 4, the ordinate indicates the "(magnetic flux leakage)/(saturation magnetization)", and the abscissa indicates the input current value (mA). The regression from the measured data to the cumulative distribution function was performed by the method of least squares. The median $\mu_1$ (mA) and the standard deviation $\sigma_1$ can be determined when the cumulative distribution function of the normal distribution is determined by the regression from the measured data. In this case, the median $\mu_1$ (mA) that is determined corresponds to the input current value $L_{P1}$ (mA) at which the measurement site becomes the temperature $T_{0.5}$ at the substrate temperature X (that is, when $\mu_1=L_{P1}$).

At the substrate temperature Y, a function $[1-\Phi\{(x-\mu 2)/\sigma_2\}]$ is similarly obtained by the regression, thereby enabling a median $\mu_2$ (mA) and a standard deviation $\sigma_2$ to be determined. The median $\mu_2$ (mA) corresponds to the input current value $L_{P2}$ (mA) at which the measurement site becomes the temperature $T_{0.5}$ at the substrate temperature Y (that is, when $\mu_2=L_{P2}$).

By substituting the input current value $L_{P1}$ that is determined by the method described above into the formula (2) described above, substituting the input current value $L_{P2}$ that is determined by the method described above into the formula (3) described above, and solving simultaneous equations, it is possible to determine the heating efficiency $C_E$ and the effective Curie temperature $T_{0.5}$. Hence, by this method, the input current value $L_{P1}=16.0$ (mA) and the input current value $L_{P2}=14.0$ (mA) can be determined from the data illustrated in FIG. 3. In addition, based on these the input current values $L_{P1}$ and $L_{P2}$, the heating efficiency $C_E=25.0$ (K/mA) and the effective Curie temperature $T_{0.5}=698$ (K) can be determined.

As an evaluation item of the magnetic layer, the distribution of the Curie temperature of the magnetic particles forming the magnetic layer can use a value $\sigma_T$ that is determined by converting the standard deviation into temperature according to the method described above. More particularly, the value $\sigma_T$ may be an arithmetic average $(\sigma_T=(C_E\times\sigma_1+C_E\times\sigma_2)/2)$ of $C_E\times\sigma_1$ and $C_E\times\sigma_2$, however, the value $\sigma_T$ is not limited thereto.

In the example described above, the heating efficiency $C_E$ and the effective Curie temperature $T_{0.5}$ are determined based on two sets of measurement data at the substrate temperature X and the substrate temperature Y, respectively. However, the heating efficiency $C_E$ and the effective Curie temperature $T_{0.5}$ may be determined based on the measured data at the substrate temperatures at three or more points. In this case, at each of the substrate temperatures, input current values $L_{P1}, L_{P2}, \ldots,$ and $L_{Pk}$ to the laser heating mechanism 40 corresponding to the Curie temperature $T_{0.5}$ are measured, where k is a natural number greater than or equal to 3, the relationship between the substrate temperature and the input current values to the laser heating mechanism 40 corresponding to the Curie temperature $T_{0.5}$ are plotted, and the regression to a straight line is performed by the method of least squares or the like. A value determined by multiplying a minus (for example, a negative coefficient) to a slope of the straight line obtained by the regression becomes the heating efficiency $C_E$. The heating efficiency $C_E$ that is determined becomes more accurate as the number of plots increase.

The plots may be distant from the straight line obtained by the regression. In this case, the Curie temperature $T_{0.5}$ that is obtained by substituting the heating efficiency $C_E$ into the formula (2) described above, and the Curie temperature $T_{0.5}$ that is obtained the substituting the heating efficiency $C_E$ into the formula (3) described above, may differ, for example. In this case, the plots may use the arithmetic average value of values $T_{0.5(1)}, T_{0.5(2)}, \ldots,$ and $T_{0.5(k)}$ obtained by substituting the heating efficiency $C_E$ into the formulas (2) and (3) described above corresponding to the substrate temperatures X and Y, respectively, for example. However, the method of obtaining the plots is not limited to such a method.

Accordingly, the Curie temperature of the thermal assist magnetic recording medium 2 and the variance of the Curie temperature can be computed, as the magnetic properties, from the relationship between the laser heating amount and the magnetic flux leakage required in step F and step I (step K).

Figure 5:
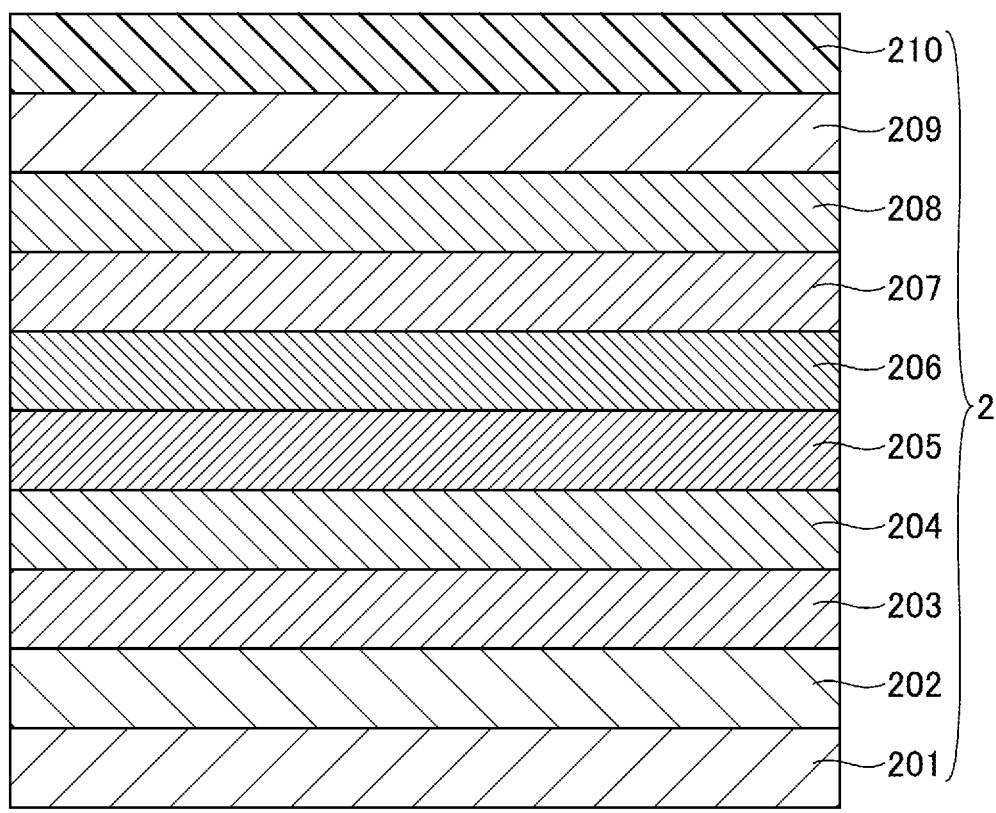
FIG. 5 is a cross sectional view illustrating an example of a thermal assist magnetic recording medium.

FIG. 5 illustrates an example of the thermal assist magnetic recording medium (or measurement sample) 2 that is measured by the magnetic property measuring method according to the present embodiment. As illustrated in FIG. 5, the thermal assist magnetic recording medium 2 includes an adhesive layer 202 and an orientation control layer 203 that are successively laminated on a substrate 201. The thermal assist magnetic recording medium 2 further includes a first heat sink layer 204, a first barrier layer 205, a second heat sink layer 206, and a second barrier layer 207 that are successively laminated on the orientation control layer 203. The first barrier layer 205 includes an oxide, a nitride, or a carbide as a main component thereof. In addition, the thermal assist magnetic recording medium 2 also includes a magnetic layer 208, a protective layer 209, and a lubricant layer 210 that are successively laminated on the second barrier layer 207. The magnetic layer 208 includes an alloy having a L1₀ structure as a main component thereof.

Because the thermal assist magnetic recording medium 2 has the configuration described above, it is possible to reduce a laser power irradiated from the magnetic head 50, while maintaining a satisfactory signal-to-noise ratio (SNR). Hence, the thermal assist magnetic recording medium 2 can increase the recording density, and also extend a serviceable life of the magnetic head 50.

These advantageous effects are obtained because the first barrier layer 205 is sandwiched between the first heat sink layer 204 and the second heat sink layer 206 having a higher thermal conductivity than the first barrier layer 205, thereby enabling efficient use of heat of the laser beam irradiated from the magnetic head 50. The first barrier layer 205 that is thin is preferably sandwiched between the first heat sink layer 204 and the second heat sink layer 206 that are thick. In this case, it is possible to form interfaces having a large difference in thermal conductivities between the first barrier layer 205 and the first heat sink layer 204, and between the first barrier layer 205 and the second heat sink layer 206, while reducing a deterioration in the effects of the heat sink layer (the first heat sink layer 204 and the second heat sink layer 206). It may be regarded that these interfaces generate a heat gradient greater than that inside the first heat sink layer 204 and the second heat sink layer 206, and that the large heat gradient increases an amount of heat transfer in a direction perpendicular to a recording surface of the thermal assist magnetic recording medium 2.

As described above, the magnetic property measuring method according to the present embodiment can measure the effective magnetic properties of the thermal assist magnetic recording medium 2 by including the steps described above. Accordingly, by using the magnetic property measuring method according to the present embodiment, it is possible to more efficiently design the heat sink layer (the first heat sink layer 204 and the second heat sink layer 206), the barrier layer (the first barrier layer 205 and the second barrier layer 207), the magnetic layer 208, and the protective layer 209 of the thermal assist magnetic recording medium 2.

The magnetic property measuring method according to the present embodiment can compute the Curie temperature of the thermal assist magnetic recording medium 2, and the variance of the Curie temperature, as the magnetic properties. For this reason, it is possible to more accurately design the laminated structure of the thermal assist magnetic recording medium 2 using the magnetic property measuring method according to the present embodiment.

In the present embodiment, steps G through step K may be performed for each of a plurality of different temperatures Y, where the different temperatures Y are temperatures Y1, Y2, Y3, or the like, for example. In this case, it is possible to more accurately determination of the heating efficiency of the laser heating mechanism 40.

According to the embodiments of the present disclosure, it is possible to measure effective magnetic properties of a magnetic layer forming a thermal assist magnetic recording medium.

Although the embodiments are described as above, the embodiments are examples and the present invention is not limited to such embodiments. The embodiments may be implemented in various other forms, and various combinations, omissions, substitutions, modifications, or the like may be made without departing from the scope of the present invention. The embodiments and modifications thereof fall within the scope of the claimed invention and equivalents thereof.

What is claimed is:

1. A magnetic property measuring apparatus that measures magnetic properties of a magnetic recording medium, comprising:
  a rotating mechanism configured to rotate the magnetic recording medium;
  a heating or cooling mechanism configured to heat or cool the magnetic recording medium;
  a temperature measuring mechanism configured to measure a temperature of the magnetic recording medium;
  a laser heating mechanism, disposed at a position opposing a measurement site of the magnetic recording medium, and configured to heat the measurement site without making contact with the measurement site;
  a magnetic write part, disposed at a position opposing the measurement site, and configured to magnetize the measurement site without making contact with the measurement site; and
  a magnetic read part, disposed at a position opposing the measurement site, and configured to read a magnetic flux leakage at the measurement site without making contact with the measurement site.

2. The magnetic property measuring apparatus as claimed in claim 1, wherein the temperature measuring mechanism is disposed at a position opposing the magnetic recording medium, and is configured to measure the temperature of the magnetic recording medium without making contact with the magnetic recording medium.

3. The magnetic property measuring apparatus as claimed in claim 1, further comprising:
  a suspension;
  a magnetic head, including the magnetic write part and the magnetic read part, and attached to the suspension; and
  a magnetic head drive mechanism configured to drive the magnetic head via the suspension,
  wherein the laser heating mechanism is attached to the magnetic head.

4. A magnetic property measuring method that measures the magnetic properties of the magnetic recording medium using the magnetic property measuring apparatus according to claim 1, comprising the steps of:
  (A) rotating the magnetic recording medium by the rotating mechanism;
  (B) causing the laser heating mechanism, the magnetic write part, and the magnetic read part to float above and scan a surface of the magnetic recording medium;
  (C) maintaining the magnetic recording medium at a temperature X that is lower than a Curie temperature by the heating or cooling mechanism and the temperature measuring mechanism;
  (D) magnetizing the measurement site of the magnetic recording medium to a saturation state by the laser heating mechanism and the magnetic write part;
  (E) demagnetizing the measurement site magnetized to the saturation state in the step (D), by heating the measurement site by the laser heating mechanism to read a magnetic flux leakage at the demagnetized site by the magnetic read part;
  (F) determining a relationship between a laser heating amount and the magnetic flux leakage in the step (E), by repeating the step (D) and the step (E);
  (G) maintaining the magnetic recording medium at a temperature Y that is lower than the Curie temperature and different from the temperature X, by the heating or cooling mechanism and the temperature measuring mechanism;

(H) reading the magnetic flux leakage at the demagnetized site by the magnetic read part, by heating and demagnetizing the measurement site magnetized to the saturation state by the laser heating mechanism;

(I) reading the magnetic flux leakage at the demagnetized site by the magnetic read part, by heating and demagnetizing the measurement site, magnetized to the saturation state in the step (H), by the laser heating mechanism;

(J) determining the relationship between the laser heating amount and the magnetic flux leakage in the step (I), by repeating the step (H) and the step (I) while varying the laser heating amount in the step (I); and (K) computing the magnetic properties of the magnetic recording medium from the relationship between the laser heating amount and the magnetic flux leakage determined in the step (F) and the step (J).

5. The magnetic property measuring method as claimed in claim 4, wherein the magnetic properties include the Curie temperature of the magnetic recording medium and a variance of the Curie temperature.

6. A magnetic property measuring method that measures magnetic properties of a magnetic recording medium, comprising the steps of:

(A) rotating the magnetic recording medium by a rotating mechanism;

(B) causing a laser heating mechanism, a magnetic write part, and a magnetic read part to float above and scan a surface of the magnetic recording medium;

(C) maintaining the magnetic recording medium at a temperature X that is lower than a Curie temperature by a heating or cooling mechanism and a temperature measuring mechanism;

(D) magnetizing a measurement site of the magnetic recording medium to a saturation state by the laser heating mechanism and the magnetic write part;

(E) demagnetizing the measurement site magnetized to the saturation state in the step (D), by heating the measurement site by the laser heating mechanism to read a magnetic flux leakage at the demagnetized site by the magnetic read part;

(F) determining a relationship between a laser heating amount and the magnetic flux leakage in the step (E), by repeating the step (D) and the step (E);

(G) maintaining the magnetic recording medium at a temperature Y that is lower than the Curie temperature and different from the temperature X, by the heating or cooling mechanism and the temperature measuring mechanism;

(H) reading the magnetic flux leakage at the demagnetized site by the magnetic read part, by heating and demagnetizing the measurement site magnetized to the saturation state by the laser heating mechanism;

(I) reading the magnetic flux leakage at the demagnetized site by the magnetic read part, by heating and demagnetizing the measurement site, magnetized to the saturation state in the step (H), by the laser heating mechanism;

(J) determining the relationship between the laser heating amount and the magnetic flux leakage in the step (I), by repeating the step (H) and the step (I) while varying the laser heating amount in the step (I); and (K) computing the magnetic properties of the magnetic recording medium from the relationship between the laser heating amount and the magnetic flux leakage determined in the step (F) and the step (J).

7. The magnetic property measuring method as claimed in claim 6, wherein the magnetic properties include the Curie temperature of the magnetic recording medium and a variance of the Curie temperature.

* * * * *